Jan. 27, 1970 A. MEYERHOFF 3,492,545

ELECTRICALLY AND THERMALLY CONDUCTIVE MALLEABLE LAYER EMBODYING LEAD FOIL

Filed March 18, 1968

WITNESSES:

Helen M. Farkas

Donald M. Winegar

INVENTOR

Alfred Meyerhoff

BY

C. L. Menzemer

ATTORNEY

United States Patent Office 3,492,545
Patented Jan. 27, 1970

3,492,545

ELECTRICALLY AND THERMALLY CONDUCTIVE MALLEABLE LAYER EMBODYING LEAD FOIL

Alfred Meyerhoff, Greensburg, Pa., assignor to Westinghouse Electric Corporation, Pittsburgh, Pa., a corporation of Pennsylvania Filed Mar. 18, 1968, Ser. No. 713,916
Int. Cl. H01l *5/00, 7/32;* B23k *31/02*
U.S. Cl. 317—234 10 Claims

ABSTRACT OF THE DISCLOSURE

An electrically and thermally conductive malleable layer of material comprises a central member of lead foil having at least two major opposed surfaces. An electrically conductive material, preferably silver, is disposed on at least each of the two major surfaces of the lead foil member.

BACKGROUND OF THE INVENTION

Field of the invention

This invention relates to electrical contacts suitable for use in semiconductor devices.

Description of the prior art

The contact resistance and the achievement of good heat conducting surfaces encountered between components in semiconductor devices is minimized by such suitable means as generating mating surfaces having a very smooth surface finish and a high degree of flatness. To accomplish these requirements, costly machining processes, both mechanical and chemical, may be employed to obtain the desired minimum electrical contact resistance.

SUMMARY OF THE INVENTION

In accordance with the invention there is provided an electrically and thermally conductive malleable layer of material consisting of a layer of lead foil having two major opposed surfaces and a layer of electrically conductive material disposed on at least each of the two major opposed surfaces.

It is an object of this invention to reduce the contact resistance and the thermal impedance encountered between the components employed in semiconductor devices.

It is another object of this invention to reduce the cost of manufacturing semiconductor devices while decreasing the contact resistance and the thermal impedance of said semiconductor devices.

Other objects of this invention will, in part, be obvious and will, in part, appear hereinafter.

For a better understanding of the nature and objects of the present invention, reference should be had to the following drawings, in which.

DESCRIPTION OF THE INVENTION

Figure 1:
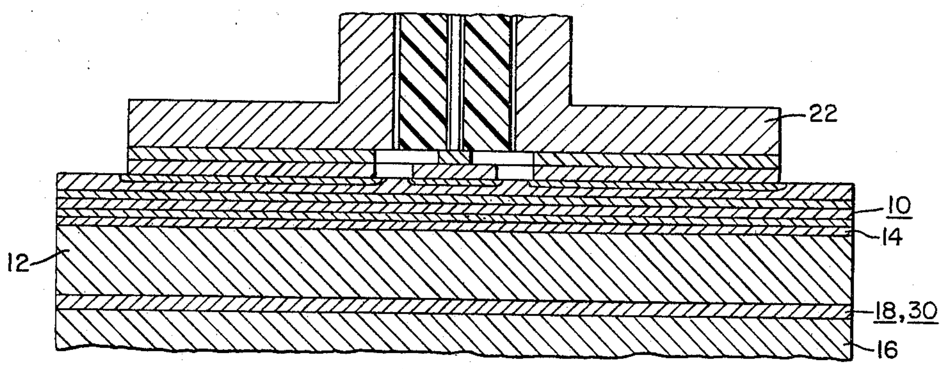
FIGURE 1 is an enlarged view in cross-section of a portion of a semiconductor device.

With reference to FIG. 1, there is shown an enlarged view of a portion of an electrical device in which components are retained in good electrical and thermal contact by compression bonding. A semiconductor element 10 is affixed to a back-up electrode 12 by a layer 14 of a suitable electrical solder. The element 10, affixed to the back-up electrode 12, is disposed on a support member 16 of a stud mounted semiconductor device. To assure good electrical contact between the electrode 12 and the support member 16, and to provide as uniform as possible force distribution between the components, an electrically and thermally conductive malleable layer 18 is disposed between them. In prior art electrical devices, the layer 18 is preferably made of silver. In a similar manner and for the same purpose as the layer 18, an electrically and thermally conductive malleable layer 20 is disposed between the element 10 and an electrical contact 22.

The preferred methods of manufacturing each layer 18 and 20, the back-up electrode 16 and the contact 22 provide surfaces which, when contiguous to each other, are essentially in continuous contact along their entire boundary surfaces. To obtain these essentially smooth surfaces, separate finishing operations are required. Likewise, the element 10 has a relatively uneven surface and therefore has numerous high and low spots. The layers 18 and 20 are stiff and consequently only numerous point contacts exist between the element 10 and the layer 20 resulting in inefficient thermal transmissions between components and high point contact resistances with a subsequent reduction in the lifetime of the electrical device embodying the element 10.

An electric contact in order to replace the layers 18 and 20 must be a good electrical conductor. The oxides of the material comprising the electrical contact, and which are inherently present, must add as little as possible to the contact impedance. The contact must also be malleable enough in order to have the capability of conforming to the surface irregularities resulting from either machining or chemical etching processes. Additionally, the contact must have a melting point which is greater than the operating temperature of the semiconductor device as well as having a relatively low cost.

A suitable material is indium. However, the melting point of indium is 155° C. and many of the electrical devices employing the layers 18 and 20 operate at a temperature in excess of 150° C., particularly under transient and current surge condition.

As stated previously silver is a suitable material. Additionally, silver oxide is also a good electrical and thermal conductor. However, silver has a yield strength high enough to make a foil member too stiff to be able to conform to all the surface irregularities in contact with it. Copper has good electrical conductivity but its yield strength in the annealed condition exceeds that of silver. Gold, platinum, palladium and other precious metals all have a greater yield strength in the annealed condition than silver.

Lead has a yield strength of less than 1640 p.s.i. and an electrical resistivity of 20.6 microohm-cm. at room temperature. Additionally lead coalesces at room temperature and does not work harden as easily as silver.

Therefore a compromise of the desired properties is required. A good malleable material sandwiched between good electrical contact metal in foil form is an excellent substitute for the layers 18 and 20.

Figures 2, 3, 4:
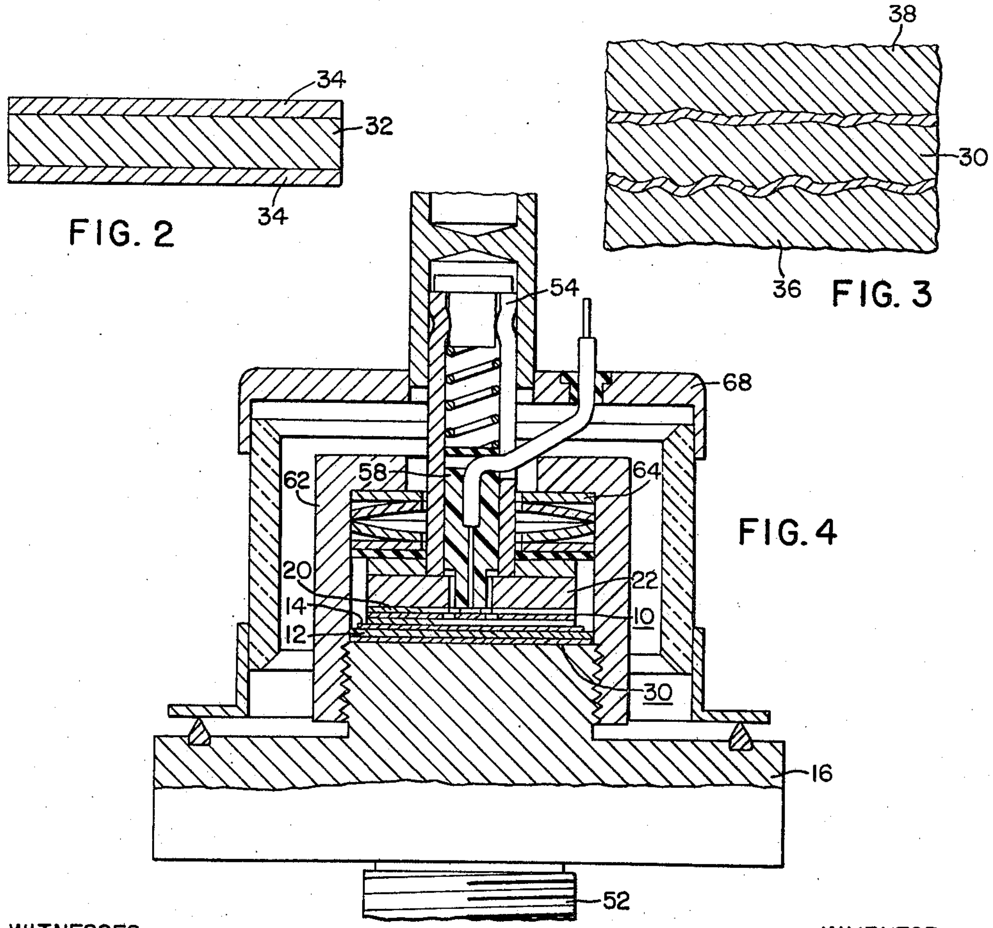
FIG. 2 is a cross-sectional view of an electrically and thermally conductive malleable layer of material made in accordance with the teachings of this invention.
FIG. 3 is an enlarged cross-sectional view, of a portion of a semiconductor device embodying the malleable layer of material of this invention.
FIG. 4 is a view, partly in cross-section, of a semiconductor device embodying the electrically and thermally conductive malleable layer of material made in accordance with the teachings of this invention.

Referring now to FIG. 2 there is shown an improved thermally and electrically conductive malleable layer 30 of material which can be substituted for at least the prior art malleable layer 18 and additionally for the prior art layer 20 if desired.

The layer 30 comprises a composite consisting of a first member 32 having two major opposed surfaces and a layer 34 of an electrically conductive material disposed on at least each of the major surfaces. Preferably the member 32 is encapsulated within the material comprising the layer 34. However, in manufacturing the composite a large sheet of lead may be coated with an electrically conductive material on all sides and indivdual preforms are then stamped from the coated sheet. Therefore, each preform may, or may not, have electrically conductive material on its side surfaces.

The member 32 preferably comprises lead and the layer 34 preferably comprises annealed silver from 10 to 20 millionths of an inch thick. The layer 34 may be disposed on the member 32 in any suitable manner such, for example as by electro-deposition. The layer 30 has a thickness of less than 5 one-thousandths of an inch. An approximate thickness of 3 one-thousandths of an inch is desirable since it is firm enough to be handled and yet is not too thick as to have an undesirably high electrical and thermal resistance. Platinum, gold, and other process metals may be substituted for the silver comprising the layer 34.

With reference to FIG. 3 there is shown an enlarged view of the layer 30 after it has been deformed in a compression bonded encapsulated electrical device. In a typical example of its application, the layer 30 is disposed between a pedestal portion 36 of the electrical device and a back-up electrode 38 to which is attached a semiconductor element. Under the resilient force of the compression bonding means, the malleable layer 30 has readily deformed and provides a good uniform electrical and thermally conductive contact between the two components 36 and 38.

The malleable layer 30 eliminates the requirement for costly finish machining operations on components of the electrical device employing it. Components can now be employed after cleaning directly from the screw machines thereby effecting a sizeable cost reduction while ensuring one that a good thermal and electrical contact exists between the pedestal 36 and the back-up electrode 38.

With reference to FIG. 4 there is shown an electrical device 50 embodying the malleable layer 18 of this invention. The device 50 comprises the support member 16 which is a massive metal member, which member 16 may be made of copper, brass, aluminum or any other suitable electrically and thermally conductive material. The member 16 has at is lower end a threaded portion 52 for assembling the device 50 into electrical apparatus.

Disposed on the pedestal portion of the support member 16 is at least one electrically and thermally conductive layer 30. The back-up electrode 12, with the semiconductor element 10 affixed thereto by the solder layer 14, is disposed on the malleable layer 30.

A cathode-gate subassembly 54 is disposed on the semiconductor element 10 and comprises, in part, the electrical contact 22 with the malleable layer 20 disposed between the contact 22 and the element 10. The layer 20 may also comprise a silver coated lead foil like the layer 30. A gate or control lead 56 extends downwardly through a slot in the side wall of the hollow portion of the subassembly 54, through the center of a slidable insulating plug 58, and terminates in a button-shaped contact member 60. A cup-shaped member 62, threadedly engaged to the pedestal portion of the member 16 cooperating with resilient force means 64 and 66 retains the contacts 22 and 30, the malleable layer 20, the element 10 and the back-up electrode 12 to which it is affixed, the malleable layer 30, and the support member 16 in an electrical and thermal conductive relationship with each other by compression bonding. The device 50 is completed by hermetically sealing the assembled components within a header assembly 68.

For a more detailed explanation of the assembly of the device 50, one should note the teachings of J. J. Steinmetz, Jr. et al. in U.S. Patent 3,296,506 assigned to the same assignee of this invention.

The thermal-impedance of the improved thermally and electrically malleable layer as compared to prior art malleable layers is shown in the following table, the malleable layers being tested in electrical devices as shown in FIG. 4.

TABLE I.—THERMAL IMPEDANCE COMPARISONS
[All values shown given in ° C./watt]

| | Device A | Device B | Device C | Device D |
|---|---|---|---|---|
| a | .173 | .241 | .246 | .317 |
| b | .190 | .283 | .300 | .381 |
| c | .198 | .271 | .270 | .254 |
| d | .248 | .255 | .241 | .273 |
| e | .203 | .233 | .291 | .351 |
| f | .254 | .321 | .259 | .410 |
| g | .276 | .233 | .239 | .277 |
| h | .209 | .226 | .236 | .390 |
| i | .210 | .245 | .244 | .329 |
| j | .280 | .237 | .282 | .245 |
| k | .233 | .243 | .244 | .218 |
| l | .251 | .230 | .264 | .274 |
| m | .274 | .229 | .275 | .260 |
| n | .200 | .234 | .301 | .388 |
| o | .231 | .201 | .223 | .325 |
| p | .197 | .253 | .295 | .220 |
| q | .268 | .256 | .272 | .288 |
| r | .252 | .415 | .252 | .300 |
| s | .185 | .302 | .262 | .260 |

NOTES: all devices were stud mounted compression bonded electrical devices. Device A employed one silver plated lead foil disposed between the molybdenum back-up electrode, FIG. 1, item 12 and a copper support member, FIG. 1, item 16.

Device B employed two silver plated lead foils, disposed between the molybdenum back-up electrode, FIG. 1, item 12 and a copper support member, FIG. 1, item 16.

Device C employed one pure silver foil disposed between the back-up electrode, FIG. 1, item 12 and the support member, FIG. 1, item 16.

Device D employed two pure silver foils disposed between the back-up electrode, FIG. 1, item 12 and the support member, FIG. 1, item 16.

From the tabulated data one readily sees that the devices employing the silver plated lead foil malleable layer had the lowest averaged thermal impedance value.

The improved malleable layer of this invention reduces the cost of producing compression bonded semiconductor devices by eliminating previously required costly very smooth surface finishes and high degree of flatness of some of the components.

While the invention has been described with reference to particular embodiments and examples, it will be understood of course, that modifications, substitutions, and the like may be made therein without departing from its scope.

I claim as my invention:

1. An electrically and thermally conductive malleable layer of material consisting of a layer of lead foil having two major opposed surfaces and a layer of electrically conductive material disposed on at least each of the two major opposed surfaces, said layer of electrically conductive material comprises a material selected from the group consisting of silver, gold, platinum and palladium.

2. The malleable layer of material of claim 1 in which the thickness of the malleable layer is less than 5 one thousandths of an inch and each of the layers of electrically conductive material is from 10 to 20 millionths of an inch.

3. The malleable layer of material of claim 2 in which the thickness of the malleable layer is approximately 3 one thousandths of an inch.

4. The malleable layer of material of claim 2 in which the layer of electrically conductive material comprises silver.

5. The malleable layer of material of claim 3 in which the layer of electrically conductive material comprises silver.

6. A semiconductor device comprising a support member;

at least one electrically and thermally conductive malleable layer disposed on said support member, said malleable layer comprising a layer of lead foil having two major opposed surfaces and a layer of electrically conductive material selected from the group consisting of silver, gold, platinum and palladium disposed on each of the two major opposed surfaces, a semiconductor assembly disposed on said malleable layer, said assembly comprising a semiconductor element having at least two regions of opposite type semiconductivity and a rectifying junction formed therebetween, and a back-up electrode, said element being affixed to, and in an electrically and thermally conductive relationship with, said electrode;

at least one electrical contact disposed on, and in electrical conductive relationship with, said semiconductor element of said semiconductor assembly; and means for resiliently urging said support member, said malleable layer, said semiconductor assembly, and said electrical contact into an electrically and thermally conductive relationship with each other.

7. The semiconductor device of claim 6 in which the thickness of each malleable layer is less than 5 one thousandths of an inch and the thickness of each layer of electrically conductive material is from 10 to 20 millionths of an inch.

8. The semiconductor device of claim 7 in which a second electrically and thermally conductive malleable layer is disposed between said semiconductor element and said electrical contact.

9. The semiconductor device of claim 7 in which the electrically conductive material of the malleable layer comprises silver.

10. The semiconductor device of claim 10 in which the electrically conductive material of each malleable layer comprises silver.

References Cited

UNITED STATES PATENTS 3,254,393 6/1966 Grasser ------------ 29—472.3

JOHN W. HUCKERT, Primary Examiner

R. F. POLISSACIC, Assistant Examiner

U.S. Cl. X.R.

29—194, 199, 472.3, 589, 591; 317—235